United States Patent
Chiou et al.

(12) 
(10) Patent No.: US 6,251,725 B1
(45) Date of Patent: Jun. 26, 2001

(54) METHOD OF FABRICATING A DRAM STORAGE NODE ON A SEMICONDUCTOR WAFER

(75) Inventors: Jung-Chao Chiou; Te-Yuan Wu, both of Hsin-Chu; Chuan-Fu Wang, Sanchung, all of (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 09/479,934

(22) Filed: Jan. 10, 2000

(51) Int. Cl.[7] .................................... H01L 21/8242
(52) U.S. Cl. ..................... 438/253; 438/396; 438/654
(58) Field of Search ............................ 438/239, 243, 438/253, 396, 652, 654; 257/307, 311

(56) References Cited

U.S. PATENT DOCUMENTS 5,701,647 * 12/1997 Saenger et al. ..................... 29/25.42
6,124,165 * 9/2000 Lien ..................................... 438/253
6,136,695 * 10/2000 Lee et al. ............................ 438/637

\* cited by examiner

*Primary Examiner*—Wael Fahmy
*Assistant Examiner*—William M. Brewster
(74) *Attorney, Agent, or Firm*—Winston Hsu

(57) ABSTRACT

A semiconductor wafer comprises a substrate, a first conductive layer and a dielectric layer covering the first conductive layer. A thin-film layer is formed over the dielectric layer. The thin-film layer comprises a hole that penetrates down to the surface of the dielectric layer and the hole is located above the first conductive layer. A first barrier layer is formed on the surface of the semiconductor wafer to cover the thin-film layer. Next, a spacer is formed on the internal walls of the hole. Thereafter, a first dry etching process is performed to form a contact hole. A second barrier layer is then formed on the internal walls of the contact hole. A second conductive layer is formed on the surface of the semiconductor wafer that fills the contact hole. A lithographic process is performed to define a pattern and a location of the storage node in a photo resist layer above the contact hole. A second dry etching process is used to etch the second conductive layer using the photo resist layer as a mask so as to form the storage node. Finally, the photo resist layer is removed.

20 Claims, 9 Drawing Sheets

METHOD OF FABRICATING A DRAM STORAGE NODE ON A SEMICONDUCTOR WAFER

BACKGROUND OF THE INVENTION

1. Field of the Invention

The present invention relates to a method of fabricating a dynamic random access memory (DRAM) storage node on a semiconductor wafer, and more particularly, to a method of preventing oxidation of a node contact of a DRAM storage node on a semiconductor wafer.

2. Description of the Prior Art

Dynamic random access memory (DRAM) devices are used extensively in the electronics industry for information storage. A high density DRAM, such as a 64 megabit DRAM, comprises millions of memory cells. Each memory cell on the DRAM chip comprises a pass transistor, e.g. a metal-oxide-semiconductor field-effect transistor (MOSFET), and a storage capacitor for storing charge. The storage capacitor comprises a top electrode, a storage node and a capacitor dielectric layer between the top electrode and the storage node. The electric charge is read and written through an access that comprises the storage node and the polysilicon that fills the node contact hole, and also comprises the drain of the MOSFET as well.

In the manufacturing processes for DRAM, an oxidized-silicon nitride-silicon oxide (ONO) process is most commonly used to form the capacitor dielectric layer. However, the phenomenon of grain boundary oxidation of the polysilicon that fills in the node contact hole is usually observed after performing the oxygen-containing ONO process. Oxidation of the polysilicon grains will significantly increase the volume of the polysilicon grains and results in a peeling problem of the storage node. As the dimensions of the node contact hole shrink, and the thickness of the capacitor dielectric layer gets thinner, the problem of grain boundary oxidation becomes more critical for the production yield.

Figure 1:
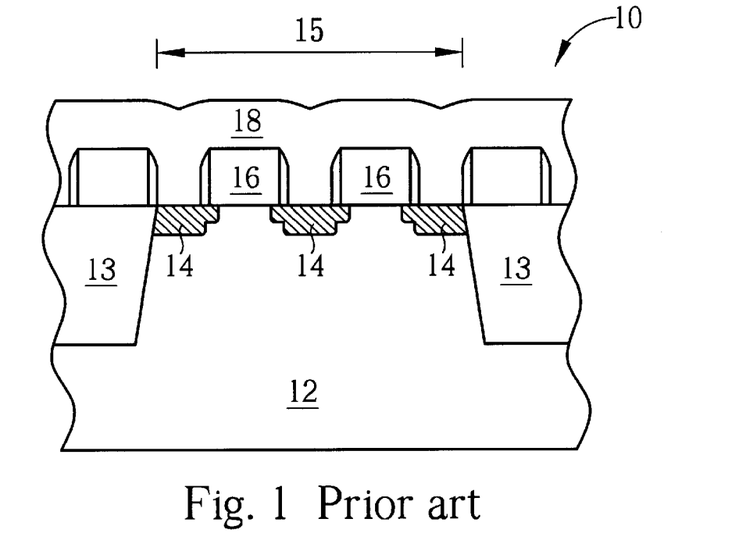
FIG. 1 to FIG. 6 are cross-sectional diagrams of the prior art method of fabricating a DRAM storage node on a semiconductor wafer.

Please refer to FIG. 1 to FIG. 6. FIG. 1 to FIG. 6 are cross-sectional diagrams of a prior art method of fabricating a DRAM storage node 28 on a semiconductor wafer 10. As shown in FIG. 1, the semiconductor wafer 10 comprises a silicon substrate 12, a shallow trench 13 positioned on the surface of the silicon substrate 12 and an active area 15 isolated by the shallow trench 13. The active area 15 comprises two gates 16 adjacent to each other, a source and a drain (S/D) 14 positioned on the surface of the silicon substrate 12 adjacent to the two gates 16, and a dielectric layer 18 positioned on the surface of the silicon substrate 12 covering the gates 16. The source and the drain 14 serve as a conductive layer of a MOS transistor. The dielectric layer 18 is composed of silicon oxide.

Figure 2:
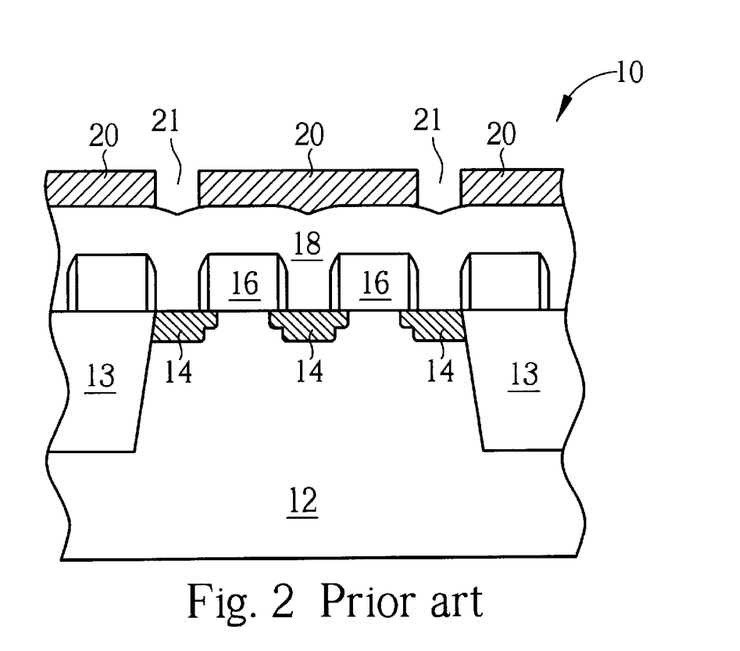

As shown in FIG. 2, a low pressure chemical vapor deposition (LPCVD) process with silane ($SiH_4$) as a reacting gas is first used to form a thin-film layer 20 with a thickness of about 2000 angstroms over the dielectric layer 18. The thin-film layer 20 is composed of amorphous silicon ($\alpha$-Si). Then, a conventional lithographic process is used to form a hole 21 that penetrates down to the surface of the dielectric layer 18 in the thin-film layer 20 so as to define the location of the node contact hole.

Figure 3:
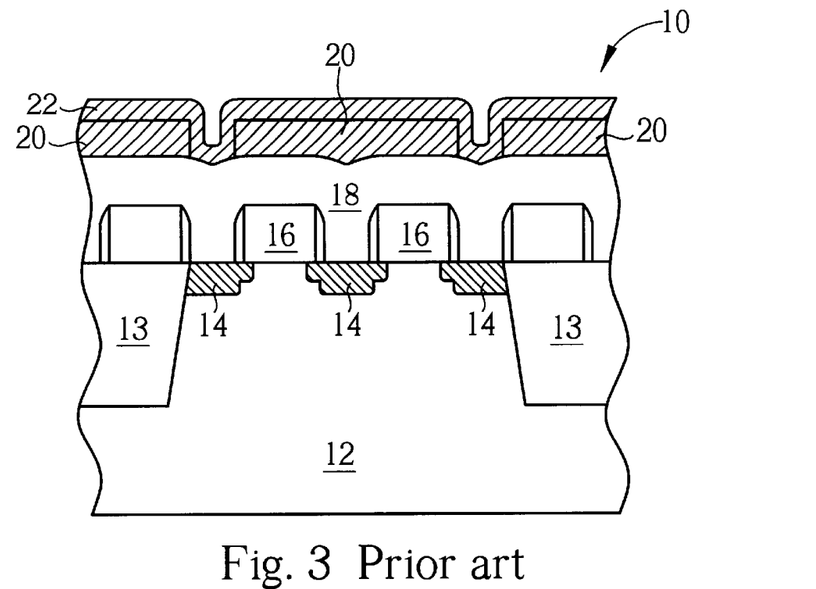

In the prior art method, spacers 23 are formed on the internal walls of the hole 21 in order to fabricate a node contact hole 24 with a dimension below 0.18 micrometers. As shown in FIG. 3, the first step of forming the spacer 23 is to deposit an amorphous silicon layer 22 with a thickness of about 400 to 500 angstroms on the surface of the semiconductor wafer 10. The amorphous silicon layer 22 is uniformly formed on the surface of the dielectric layer 20, the internal walls of the hole 21 and the bottom of the hole 21 using an LPCVD process.

Figure 4:
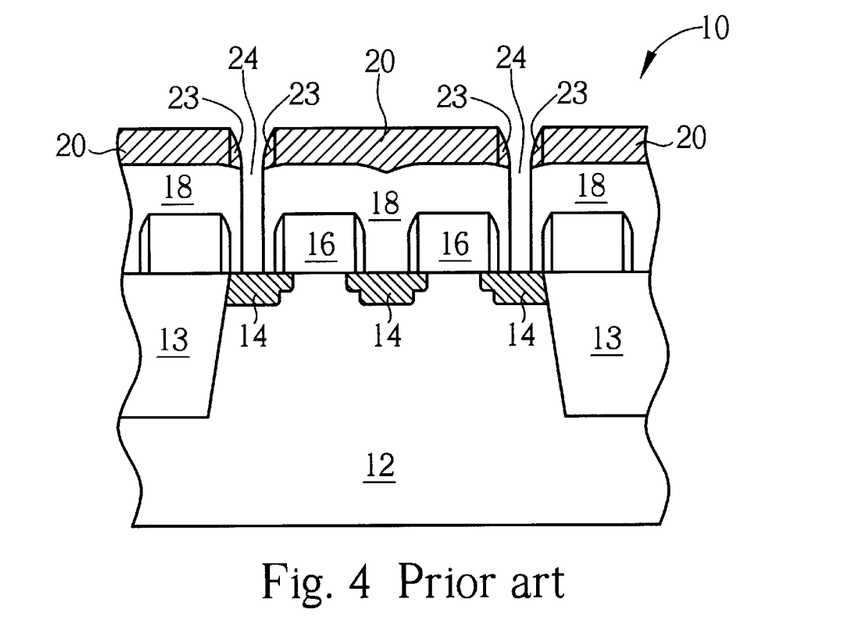

Next, as shown in FIG. 4, an etching back process is performed to remove the amorphous silicon layer 22 from the surface of the dielectric layer 20 and from the bottom of the hole 21. The remaining portions of the amorphous silicon layer 22 on the internal walls of the hole 21 form the spacers 23. The spacers 23 and the thin-film layer 20 form a hard mask for the subsequent etching process. An anisotropic dry etching process is performed to etch the dielectric layer 18 that is not covered by the hard mask to the surface of the S/D 14 so as to form a contact hole 24.

Figure 5:
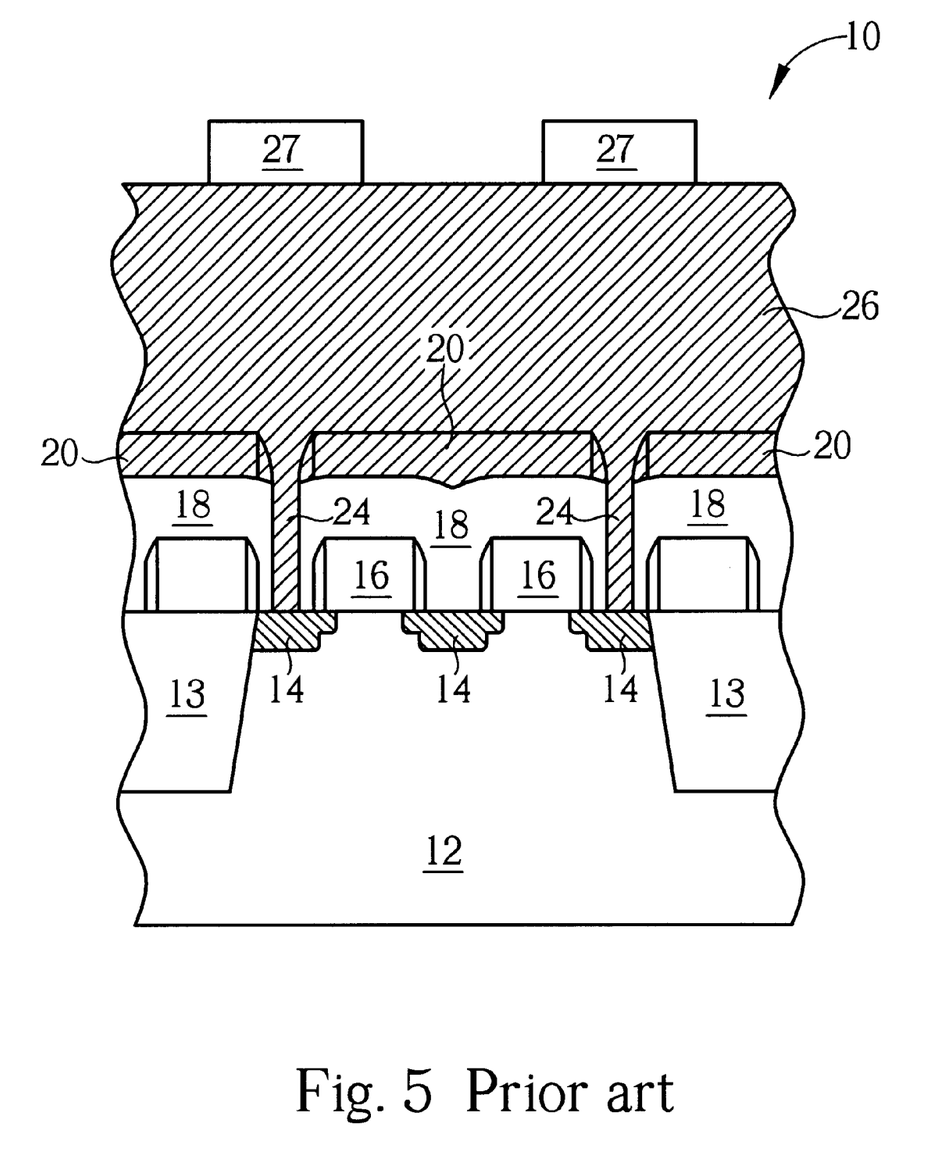

Next, as shown in FIG. 5, a conductive layer 26 comprising amorphous silicon and phosphorus is formed on the surface of the semiconductor wafer 10, filling the contact hole 24. An LPCVD process, with silane ($SiH_4$) and phosphine ($PH_3$) as the reacting gasses, is used to form the conductive layer 26. The thickness of the conductive layer 26 is about 8000 angstroms so that the storage node has a sufficient exposed surface area to store the required electric charge. Then, a conventional lithographic process is performed and a photo resist layer 27 is used to define the location of the storage node 28.

Figure 6:
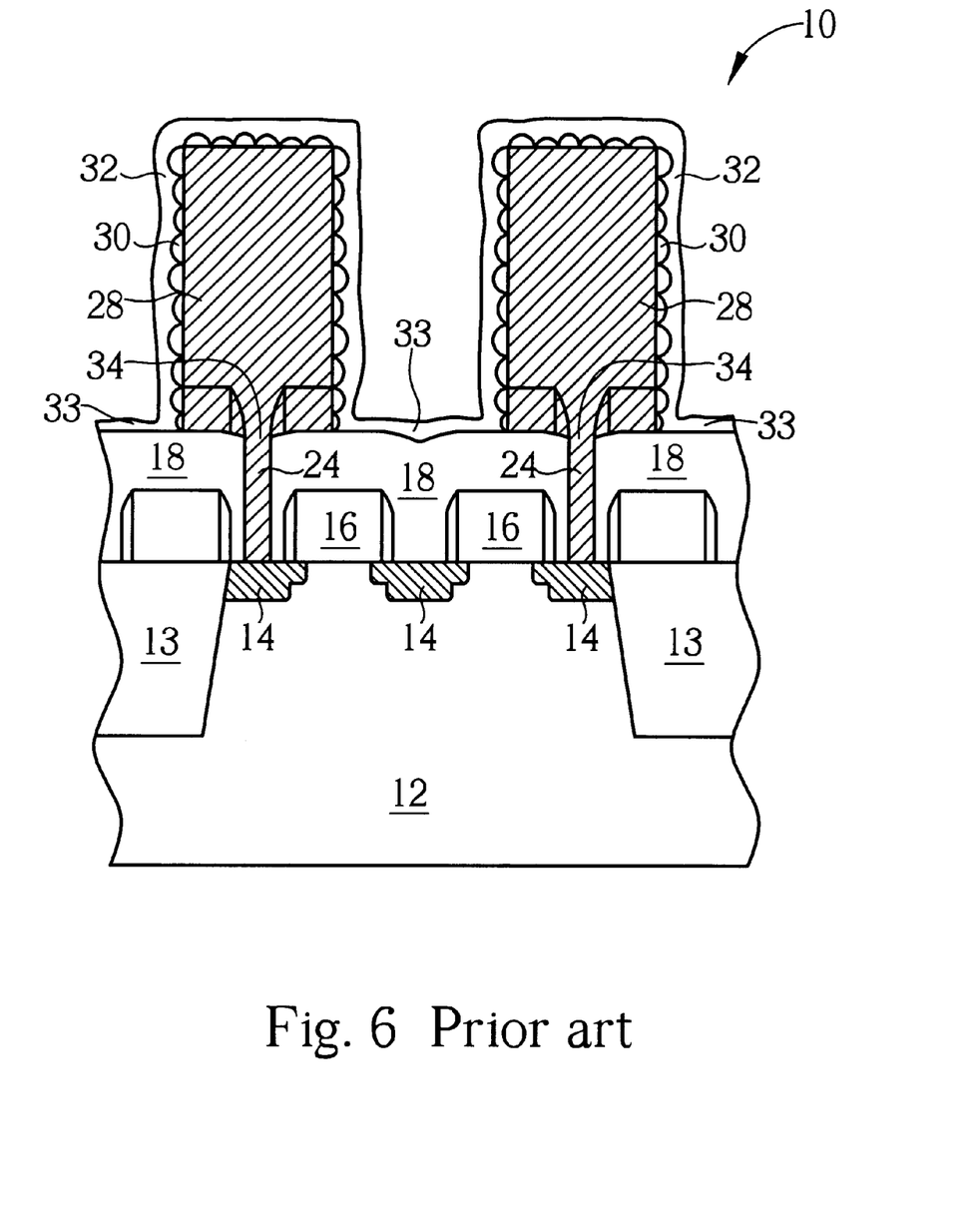

Next, as shown in FIG. 6, a dry etching process is performed to remove the conductive layer 26, and the thin-film layer 20, that are not covered by the photo resist layer 27 down to the surface of the dielectric layer 18. The photo resist layer 27 is then removed, thereby completing the storage node 28.

After completing the storage node 28, an ultra-high vacuum chemical vapor deposition (UHV CVD) process follows to form a polysilicon layer 30 with a hemi-spherical grain structure on the exposed surface of the storage node 28 so as to increase the area on the storage node 28 for storing electric charge. In the UHV CVD process, the operating pressure of the vacuum chamber is below 1 torr and the operating temperature is between about 550 to 800 Celsius degrees. Subsequently, an annealing process in a nitrogen atmosphere is used to drive the phosphoric atoms in the storage node 28 into the polysilicon layer 30. This also transforms the storage node 28 into polysilicon.

Next, an ONO (oxidized-silicon nitride-silicon oxide) process is performed to form a capacitor dielectric layer 32, with a thickness that is between about 30 to 100 angstroms, over the polysilicon layer 30. In the ONO process, a native oxide layer (not shown) is first formed on the surface of the polysilicon layer 30 with a thickness of about 10 to 50 angstroms. Then, a plasma-enhanced CVD process, or an LPCVD process, is performed to form a silicon nitride layer (not shown) with a thickness of about 45 angstroms. At that time, a silicon nitride layer 33 with a thickness of about 25 angstroms is formed on the surface of the dielectric layer 18. Finally, a healing process is performed to form a silicon oxy-nitride layer with a thickness between 40 to 82 angstroms over the silicon nitride layer. The native oxide, the silicon nitride layer and the silicon oxy-nitride layer form the capacitor dielectric layer. The healing process is done in an oxygen-containing atmosphere at about 800 Celsius degrees for approximately 30 minutes. The silicon oxy-nitride layer is used to reduce the leakage current that results from defects in the silicon nitride layer.

In general, the charge storage capacity of a DRAM capacitor can be increased in several ways, including:

1. Choosing a material that has a high dielectric constant to form the capacitor dielectric layer 32.
2. Reducing the thickness of the capacitor dielectric layer 32.
3. Increasing the surface area of a capacitor.

Consequently, reducing the thickness of the silicon nitride layer in the capacitor dielectric layer 32 results in a better charge storage capacity of a DRAM capacitor.

However, reducing the thickness of the silicon nitride layer in the capacitor dielectric layer 32 will also reduce the thickness of the silicon nitride layer 33 formed on the surface of the dielectric layer 18. A thin silicon nitride layer 32 on the surface of the dielectric layer 18 with a thickness that is less than 25 angstroms is not able to prevent oxygen from diffusing into the dielectric layer 18 during the ONO process. Oxygen diffused into the dielectric layer 18 will cause serious polysilicon grain boundary oxidation problems at the neck of the node contact hole 24. In other words, the thickness of the silicon nitride layer 32 on the surface of the dielectric layer 18 limits the thickness of the silicon nitride layer in the capacitor dielectric layer 32. In addition, oxidation of the polysilicon grains at the neck of the node contact hole also results in a bulky volume and peeling of the storage node 28. As a result, a solution to this problem is of considerable importance.

SUMMARY OF THE INVENTION

It is therefore a primary objective of the present invention to provide a method of fabricating a DRAM storage node to prevent oxidation and peeling of the storage node.

In a preferred embodiment, the present invention relates to a method of fabricating a DRAM storage node on a semiconductor wafer, the semiconductor wafer comprising a substrate, a first conductive layer positioned in a predetermined area on the surface of the substrate, and a dielectric layer positioned on the surface of the substrate covering the first conductive layer, the method comprising:

forming a thin-film layer over the dielectric layer, the thin-film layer comprising a hole that penetrates down to the surface of the dielectric layer, the hole located above the first conductive layer;

forming a first barrier layer on the surface of the semiconductor wafer to cover the thin-film layer and the internal walls of the hole;

forming a spacer on the internal walls of the hole;

performing a first dry etching process using the thinfilm layer and the spacer as hard masks to form a contact hole that penetrates the dielectric layer down to the surface of the first conductive layer;

forming a second barrier layer on the internal walls of the contact hole, the second barrier layer connecting with the first barrier layer;

forming a second conductive layer on the surface of the semiconductor wafer that fills the contact hole;

forming a first photo resist layer on the second conductive layer;

performing a first lithographic process to define a pattern and a location of the storage node in the first photo resist layer above the contact hole;

performing a second dry etching process to etch the second conductive layer using the first photo resist layer as a mask so as to form the storage node; and removing the first photo resist layer.

It is an advantage of the present invention that the second barrier layer and the first barrier layer connected to the second barrier layer prevent oxygen in the ONO process from coming into contact with the node contact.

These and other objectives of the present invention will no doubt become obvious to those of ordinary skill in the art after reading the following detailed description of the preferred embodiment which is illustrated in the various figures and drawings.

DETAILED DESCRIPTION OF THE PREFERRED EMBODIMENT

Figure 7:
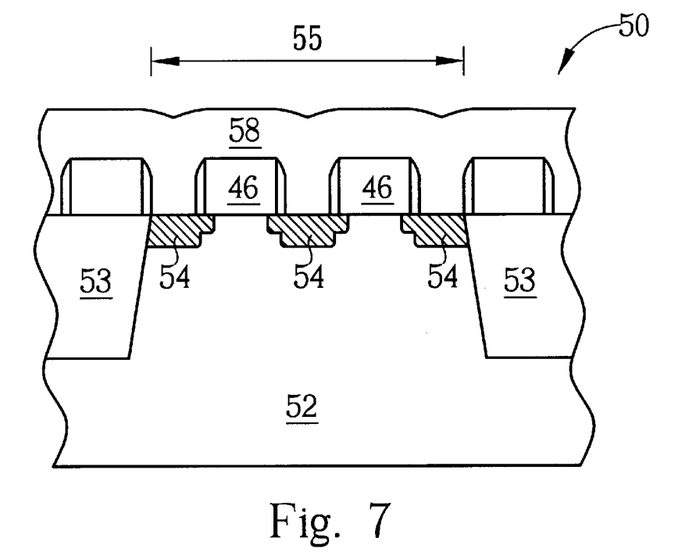
FIG. 7 to FIG. 14 are cross-sectional diagrams of fabricating a DRAM storage node on a semiconductor wafer according to present invention.

Please refer to FIG. 7 to FIG. 14. FIG. 7 to FIG. 14 are cross-sectional diagrams of fabricating a DRAM storage node 74 on a semiconductor wafer 50 according to present invention. As shown in FIG. 7, the semiconductor wafer 50 comprises a silicon substrate 52, a shallow trench 53 positioned on the surface of the silicon substrate 52 and an active area 55 isolated by the shallow trench 53. The active area 55 comprises two gates 46 adjacent to each other, a source and a drain (S/D) 54 positioned on the surface of the silicon substrate 52 adjacent to the gates 46 and a dielectric layer 58 positioned on the surface of the silicon substrate 52 covering the gates 46. The S/D 54 serves as a conductive layer of a MOS transistor. The dielectric layer 58 is composed of silicon oxide.

Figure 8:
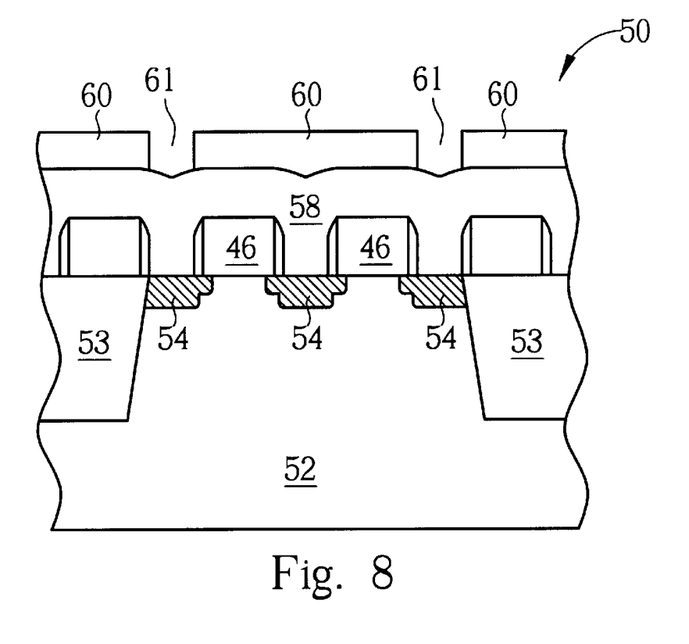

As shown in FIG. 8, an LPCVD process with silane ($SiH_4$) as a reacting gas is first used to form a thin-film layer 60, with a thickness of about 2000 angstroms, over the dielectric layer 58. The thin-film layer 60 is composed of amorphous silicon ($\alpha$-Si). Then, a conventional lithographic process is used to form a hole 61 in the thin-film layer 60 that penetrates down to the surface of the dielectric layer 58 so as to define the location of the node contact hole.

Figure 9:
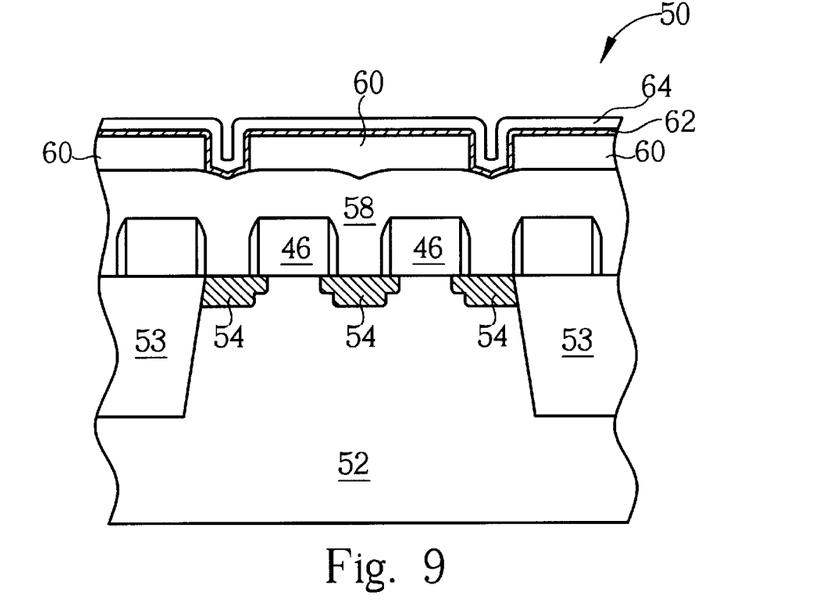

Next, as shown in FIG. 9, an LPCVD process is used to form a barrier layer 62, composed of silicon nitride, over the thin-film layer 60, as well as over the internal walls and bottom of the hole 61. Then, an amorphous silicon layer 64 is formed over the barrier layer 62. The thickness of the barrier layer 62 is about 86 angstroms and the thickness of the amorphous silicon layer is about 400 to 500 angstroms.

Figure 10:
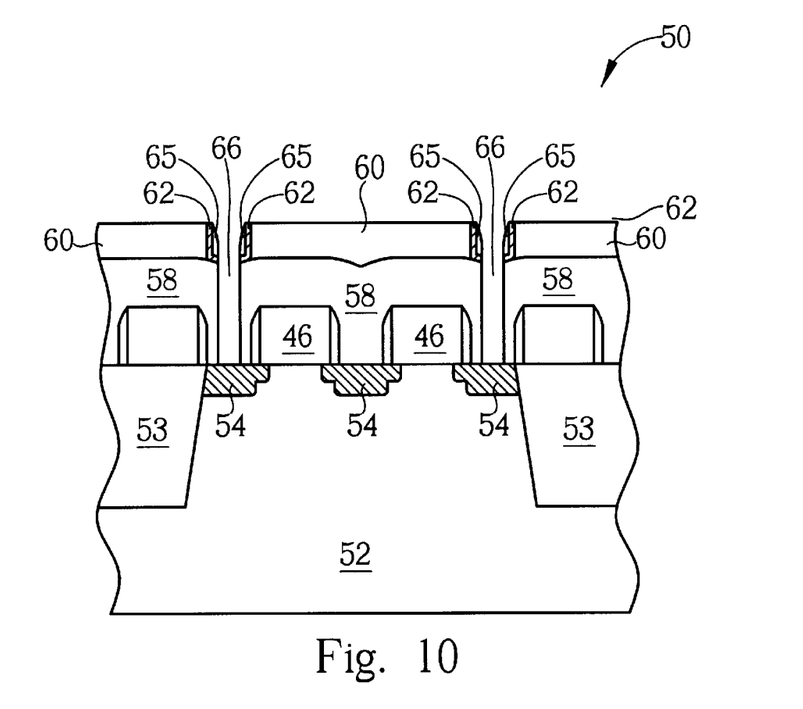

Next, as shown in FIG. 10, an etch back process is used to etch the amorphous silicon layer 64 and the barrier layer 62. The remaining portions of the amorphous silicon layer 64 and the barrier layer 62 form spacers 65 on the internal walls of the hole 61. Thereafter, using the thin-film layer 60 and the spacer 65 as hard masks, an anisotropic dry etching process is performed to form a contact hole 66 with a diameter of about 0.1 micrometers that penetrates the dielectric layer down to the surface of the S/D 54.

Figure 11:
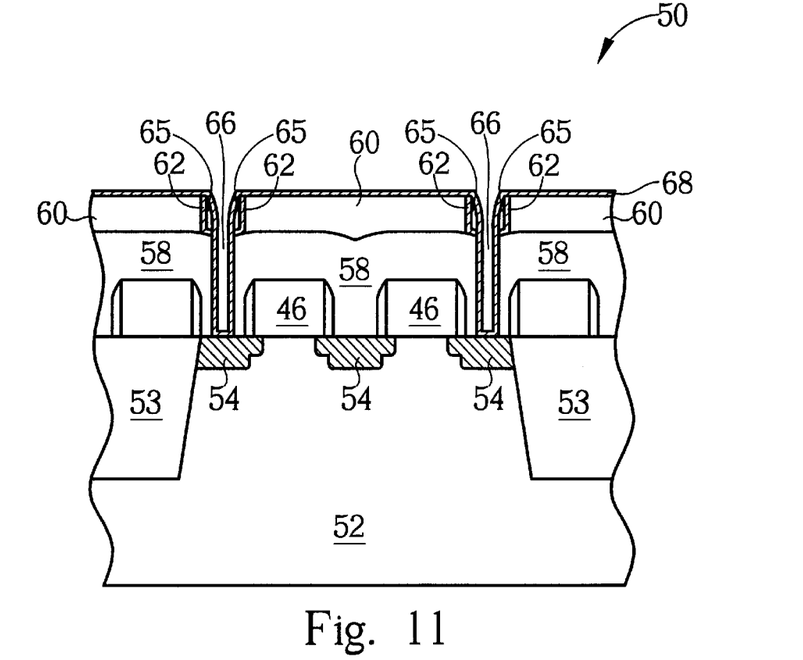
Figure 12:
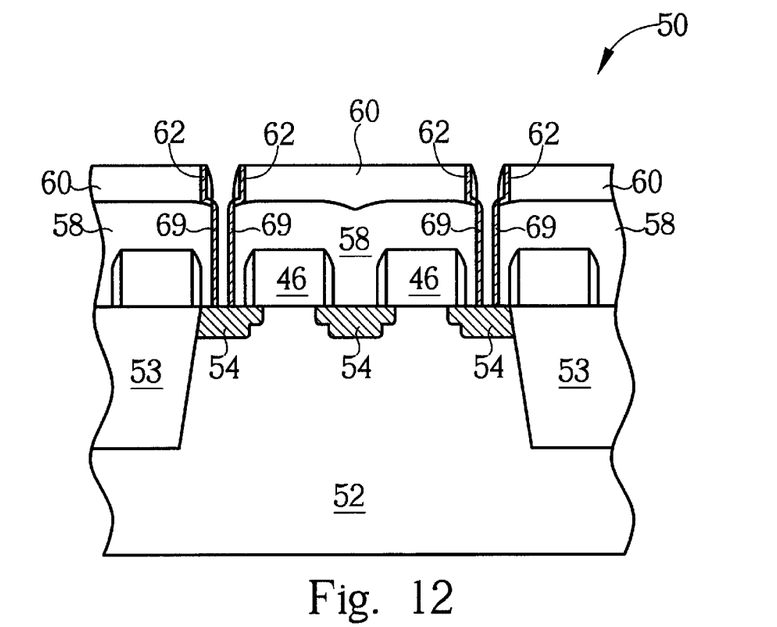

Next, as shown in FIG. 11, a silicon nitride layer 68 is formed on the surface of the semiconductor wafer 50 to uniformly cover the thin-film layer 60, the spacers 65, the internal walls of the contact hole 66, and the bottom of the contact hole 66. Several approaches are used to form the silicon nitride layer 68, such as LPCVD methods or plasma-enhanced CVD methods. As shown in FIG. 12, an etch back process is performed to etch the silicon nitride layer 68 and to expose the S/D 54, thereby forming the barrier layer 69.

Figure 13:
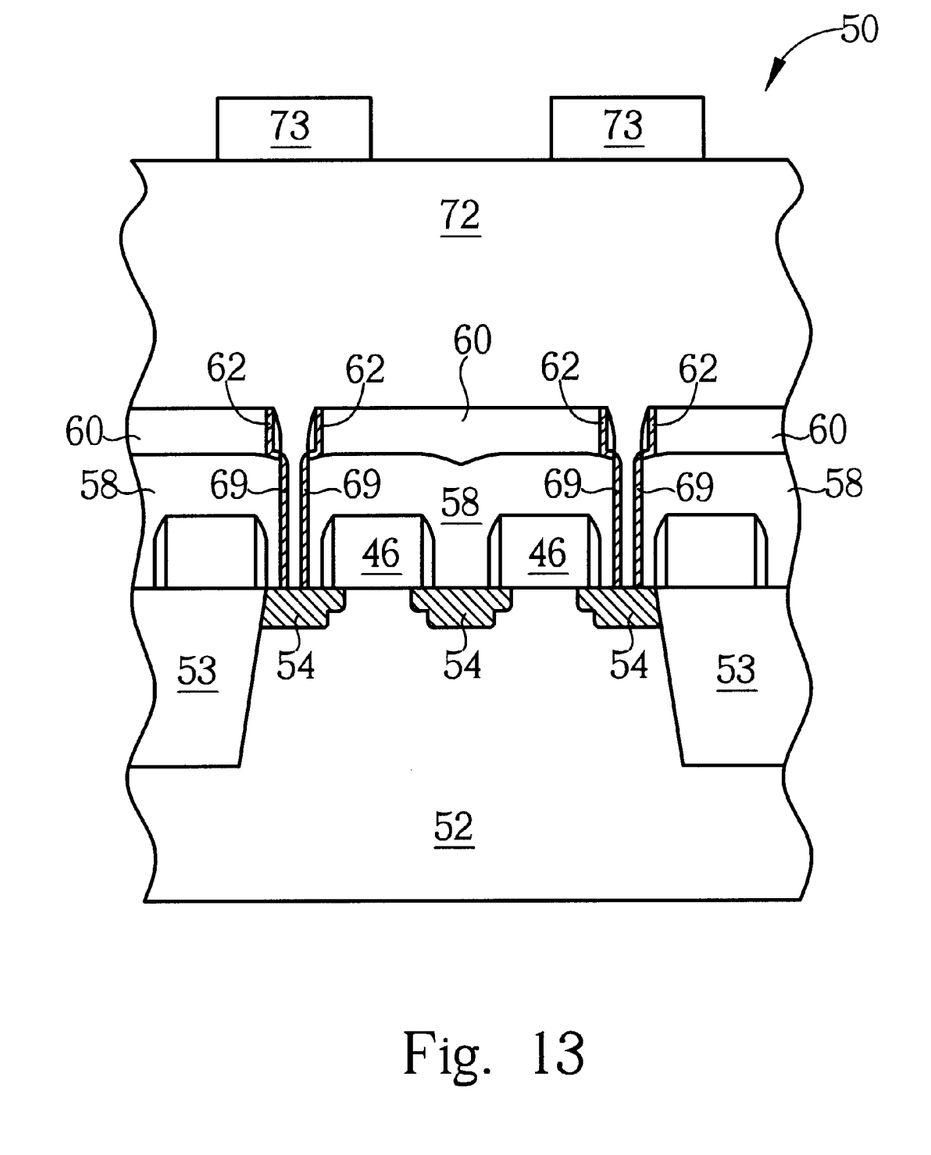
Figure 14:
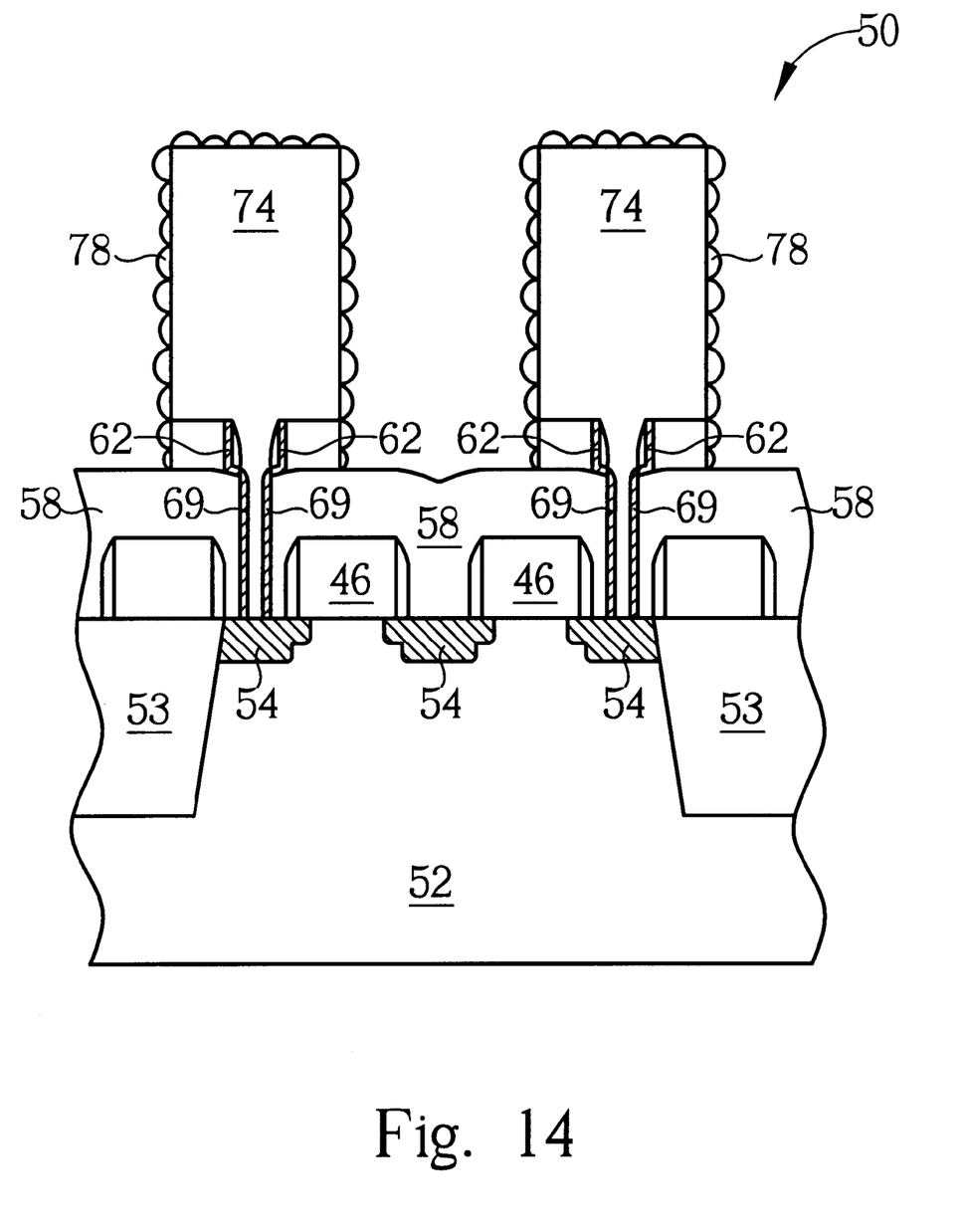

Next, as shown in FIG. 13, an LPCVD process is used to form a conductive layer 72 composed of amorphous silicon and phosphorus, with a thickness of about 8000 angstroms, on the surface of the semiconductor wafer 50. The conductive layer 72 fills the contact hole 66. Then, a lithographic process is performed, and a photo resist layer 73 is used to define the pattern and the location of the storage node 74 above the contact hole 66. A dry etching process is then used to etch the conductive layer 72, using the photo resist layer 73 as a mask, so as to form the storage node 74. The photo resist layer 73 is then completely removed. Finally, an HSG formation process is performed to form a polysilicon layer 78 with a hemi-spherical grain structure on the exposed surface of the storage node 74 so as to increase the area on the storage node 74 for storing the required electric charge. Thereafter, an annealing process in a nitrogen atmosphere is used to drive the phosphoric atoms in the storage node 74 into the polysilicon layer 78. At this time, the storage node 74 is transformed to polysilicon.

In another embodiment, the conductive layer 72 is composed of amorphous silicon and polysilicon. A polysilicon layer (not shown) is first formed on the surface of the semiconductor wafer 50 and fills the contact hole 66. Next, a chemical mechanical polishing (CMP) process is performed to completely remove the polysilicon layer outside of the contact hole 66 so as to form a polysilicon node contact (not shown). Then, an amorphous silicon layer (not shown) is formed on the surface of the semiconductor wafer 50, covering the polysilicon node contact. In addition, the present invention can be applied to a process where the contact hole 66 connects to a landing pad, and the landing pad is used to connect the S/D 54 of a MOSFET.

In contrast to the prior art, the method of fabricating a DRAM storage node 74 on a semiconductor wafer 50 according to the present invention uses the barrier layer 69, and the barrier layer 62 that connects to the barrier layer 69, to protect the polysilicon in the contact hole 66. The present invention resolves the storage node 76 peeling problem that results from grain boundary oxidation of the node contact.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A method of fabricating a DRAM storage node on a semiconductor wafer, the semiconductor wafer comprising a substrate, a first conductive layer positioned in a predetermined area on the surface of the substrate, and a dielectric layer positioned on the surface of the substrate covering the first conductive layer, the method comprising:

forming a thin-film layer over the dielectric layer, the thin-film layer comprising a hole that penetrates down to the surface of the dielectric layer, the hole located above the first conductive layer;

forming a first barrier layer on the surface of the semiconductor wafer to cover the thin-film layer and the internal walls of the hole;

forming a spacer on the internal walls of the hole;

performing a first dry etching process using the thin-film layer and the spacer as hard masks to form a contact hole that penetrates the dielectric layer down to the surface of the first conductive layer;

forming a second barrier layer on the internal walls of the contact hole, the second barrier layer connecting with the first barrier layer;

forming a second conductive layer on the surface of the semiconductor wafer that fills the contact hole;

forming a first photo resist layer on the second conductive layer;

performing a first lithographic process to define a pattern and a location of the storage node in the first photo resist layer above the contact hole;

performing a second dry etching process to etch the second conductive layer using the first photo resist layer as a mask so as to form the storage node; and removing the first photo resist layer.

2. The method of claim 1 wherein the thin-film layer is composed of amorphous silicon (α-Si).

3. The method of claim 2 wherein the following steps are used to form the hole in the thin-film layer:

forming a second photo resist layer on the surface of the thin-film layer;

performing a second lithographic process to form the pattern of the hole in the second photo resist layer above the first conductive layer;

performing an etching process to etch the thin-film layer down to the surface of the dielectric layer, using the second photo resist layer as a mask; and removing the second photo resist layer.

4. The method of claim 1 wherein the spacer is composed of amorphous silicon (α-Si).

5. The method of claim 4 wherein the following steps are used to form the spacer on the internal walls of the hole:

forming a first amorphous silicon layer on the surface of the first barrier layer; and performing a first etch back process to etch the first amorphous silicon layer and the first barrier layer, the remaining portion of the first amorphous silicon layer and first barrier layer forming the spacer on the internal walls of the hole.

6. The method of claim 1 wherein the first barrier layer and the second barrier layer are both composed of silicon nitride.

7. The method of claim 6 wherein the following steps are used to form the second barrier layer on the internal walls of the contact hole:

forming a silicon nitride layer on the surface of the semiconductor wafer to uniformly cover the thin-film layer, the spacer, the internal walls of the contact hole, and the bottom of the contact hole; and performing a second etch back process to etch the silicon nitride layer and to expose the first conductive layer, thereby forming the second barrier layer.

8. The method of claim 1 wherein the substrate is a silicon substrate, and the first conductive layer is a doped area positioned in the silicon substrate to serve as a source or a drain of a metal-oxide-semiconductor (MOS) transistor.

9. The method of claim 1 wherein the first conductive layer is a landing pad that serves to connect to a source or a drain of a MOS transistor.

10. The method of claim 1 wherein the second conductive layer is composed of amorphous silicon and poly-silicon, and the following steps are used to form the second conductive layer:

forming a poly-silicon layer on the surface of the semiconductor wafer that fills the contact hole;

performing a chemical mechanical polishing (CMP) process to completely remove the poly-silicon layer outside of the contact hole so as to form a node contact of the storage node; and forming a second amorphous silicon layer on the surface of the semiconductor wafer to cover the node contact.

11. The method of claim 1 wherein a hemi-spherical grain (HSG) process is performed after removing the first photo resist layer so as to uniformly form a poly-silicon layer with a hemi-spherical structure on the exposed surface of the storage node.

12. A method of preventing oxidation of a node contact of a DRAM storage node on a semiconductor wafer, the semiconductor wafer comprising a substrate, a conductive layer positioned in a predetermined area on the surface of the substrate, and a dielectric layer positioned on the surface of the substrate covering the first conductive layer, the method comprising:

forming a thin-film layer over the dielectric layer, the thin-film layer comprising a hole that penetrates down to the surface of the dielectric layer, the hole located above the first conductive layer;

forming a first barrier layer on the surface of the semiconductor wafer to cover the thin-film layer and the internal walls of the hole;

forming a spacer on the internal walls of the hole;

performing a first dry etching process using the thin-film layer and the spacer as hard masks to form a contact hole that penetrates the dielectric layer down to the surface of the first conductive layer;

forming a second barrier layer on the internal walls of the contact hole, the second barrier layer connecting with the first barrier layer;

forming a second conductive layer on the surface of the semiconductor wafer that fills the contact hole, thereby forming the node contact;

wherein the first barrier layer and the second barrier layer are used to protect the node contact from being oxidized.

13. The method of claim 12 wherein the thin-film layer is composed of amorphous silicon (α-Si) and the dielectric layer is composed of silicon oxide.

14. The method of claim 13 wherein the following steps are used to form the hole in the thin-film layer:

forming a photo resist layer on the surface of the thin-film layer;

performing a lithographic process to form the pattern of the hole in the photo resist layer above the conductive layer;

performing an etching process to etch the thin-film layer down to the surface of the dielectric layer, using the photo resist layer as a mask; and removing the photo resist layer.

15. The method of claim 12 wherein the spacer is composed of amorphous silicon (α-Si) and the following steps are used to form the spacer:

forming an amorphous silicon layer on the surface of the first barrier layer; and performing a first etch back process to etch the amorphous silicon layer and the first barrier layer, the remaining portion of the amorphous silicon layer and first barrier layer forming the spacer on the internal walls of the hole.

16. The method of claim 12 wherein the first barrier layer and the second barrier layer are both composed of silicon nitride.

17. The method of claim 16 wherein the following steps are used to form the second barrier layer on the internal walls of the contact hole:

forming a silicon nitride layer on the surface of the semiconductor wafer to uniformly cover the thin-film layer, the spacer, the internal walls of the contact hole, and the bottom of the contact hole; and performing a second etch back process to etch the silicon nitride layer, thereby forming the second barrier layer.

18. The method of claim 12 wherein the substrate is a silicon substrate, and the first conductive layer is a doped area positioned in the silicon substrate to serve as a source or a drain of a metal-oxide-semiconductor (MOS) transistor.

19. The method of claim 12 wherein the first conductive layer is a landing pad that serves to connect to a source or a drain of a MOS transistor.

20. The method of claim 12 wherein the second conductive layer is composed of amorphous silicon.

* * * * *